(12) United States Patent
Gonzalez et al.

(10) Patent No.: US 7,358,171 B2
(45) Date of Patent: Apr. 15, 2008

(54) METHOD TO CHEMICALLY REMOVE METAL IMPURITIES FROM POLYCIDE GATE SIDEWALLS

(75) Inventors: Fernando Gonzalez, Boise, ID (US); Don Carl Powell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 94 days.

(21) Appl. No.: 09/945,553

(22) Filed: Aug. 30, 2001

(65) Prior Publication Data

US 2003/0071316 A1    Apr. 17, 2003

(51) Int. Cl.
*H01L 21/28* (2006.01)
*H01L 21/335* (2006.01)

(52) U.S. Cl. ............ 438/592; 438/770; 438/774; 438/769; 257/E29.158

(58) Field of Classification Search .......... 438/592, 438/719, 721, 774, 769, FOR. 193, FOR. 397, 438/770; 257/E29.158
See application file for complete search history.

(56) References Cited

U.S. PATENT DOCUMENTS

| | | | | |
|---|---|---|---|---|
| 4,748,131 A * | 5/1988 | Zietlow | .......... | 438/585 |
| 5,039,349 A | 8/1991 | Schoeppel | | |
| 5,552,627 A * | 9/1996 | McCollum et al. | .......... | 257/530 |
| 5,672,525 A * | 9/1997 | Pan | .......... | 438/505 |
| 5,830,802 A | 11/1998 | Tseng et al. | | |
| 5,855,811 A | 1/1999 | Grieger et al. | | |
| 5,990,019 A | 11/1999 | Torek et al. | | |
| 6,048,803 A | 4/2000 | Gardner et al. | | |
| 6,140,163 A | 10/2000 | Gardner et al. | | |
| 6,153,509 A | 11/2000 | Watanabe et al. | | |
| 6,191,463 B1 * | 2/2001 | Mitani et al. | .......... | 257/411 |
| 6,198,144 B1 | 3/2001 | Pan et al. | .......... | 257/412 |
| 6,245,605 B1 | 6/2001 | Hwang et al. | .......... | 438/216 |
| 6,288,419 B1 * | 9/2001 | Prall et al. | .......... | 257/213 |
| 6,313,003 B1 | 11/2001 | Chen | | |
| 6,417,551 B2 * | 7/2002 | Miyano | .......... | 257/412 |
| 6,429,105 B1 | 8/2002 | Kunikiyo | | |
| 6,479,362 B2 * | 11/2002 | Cunningham | .......... | 438/369 |
| 6,593,229 B1 * | 7/2003 | Yamamoto et al. | .......... | 438/635 |
| 6,613,682 B1 * | 9/2003 | Jain et al. | .......... | 438/706 |
| 6,774,012 B1 * | 8/2004 | Narayanan | .......... | 438/471 |
| 7,029,999 B2 * | 4/2006 | Lim et al. | .......... | 438/585 |
| 2001/0014522 A1 * | 8/2001 | Weimer et al. | .......... | 438/591 |
| 2001/0051440 A1 | 12/2001 | Torek et al. | | |
| 2002/0004263 A1 * | 1/2002 | Tanabe et al. | .......... | 438/199 |
| 2002/0011461 A1 * | 1/2002 | Wege et al. | .......... | 216/41 |

(Continued)

OTHER PUBLICATIONS

Wolf, S. , *Silicon Processing for the VLSI Era*, (1), Process Technology,(1986),514-517 and 551-552.

(Continued)

*Primary Examiner*—George Fourson
(74) *Attorney, Agent, or Firm*—Schwegman, Lundberg & Woessner, P.A.

(57) ABSTRACT

An embodiment includes a process of forming a gate stack that acts to resist the redeposition to the semiconductive substrate of mobilized metal such as from a metal gate electrode. An embodiment also relates to a system that achieves the process. An embodiment also relates to a gate stack structure that provides a composition that resists the redeposition of metal during processing and field use.

16 Claims, 6 Drawing Sheets

U.S. PATENT DOCUMENTS

| | | | |
|---|---|---|---|
| 2002/0173150 A1* | 11/2002 | Kawai et al. | 438/690 |
| 2003/0045113 A1* | 3/2003 | Enomoto et al. | 438/706 |
| 2004/0051153 A1* | 3/2004 | Yamamoto et al. | 257/412 |
| 2004/0063276 A1* | 4/2004 | Yamamoto et al. | 438/241 |
| 2004/0132272 A1* | 7/2004 | Ku et al. | 438/585 |
| 2004/0171241 A1* | 9/2004 | Kitamura et al. | 438/592 |
| 2004/0259339 A1* | 12/2004 | Tanabe et al. | 438/585 |
| 2004/0266154 A1* | 12/2004 | Lim et al. | 438/592 |
| 2005/0019992 A1* | 1/2005 | Hong et al. | 438/149 |
| 2005/0085074 A1* | 4/2005 | Powell | 438/689 |
| 2005/0104114 A1 | 5/2005 | Chen et al. | |
| 2006/0261415 A1 | 11/2006 | Gonzalez et al. | |
| 2006/0261500 A1 | 11/2006 | Gonzalez et al. | |
| 2006/0289389 A1 | 12/2006 | Shea | |
| 2007/0163997 A1 | 7/2007 | Shea | |
| 2007/0178705 A1 | 8/2007 | Shea | |

OTHER PUBLICATIONS

"303 898US1 Non-Final OA Jun. 18, 2007", (Jun. 18, 2007), 14.

"U.S. Appl. No. 10/929,933, Response filed Sep. 25, 2007 to Final Office Action mailed Jul. 25, 2007", (Sep. 25, 2007), 15 pages.

"U.S. Appl. No. 11/168,023, Advisory Action mailed Mar. 30, 2007", (Mar. 30, 2007), 3 pages.

"U.S. Appl. No. 11/168,023, Final Office Action mailed Jan. 25, 2007", (Jan. 25, 2007), 14 pages.

"U.S. Appl. No. 11/168,023, Non-Final Office Action mailed Jun. 18, 2007", (Jun. 18, 2007), 14 pages.

"U.S. Appl. No. 11/168,023, Non-Final Office Action mailed Sep. 14, 2006", (Sep. 14, 2006), 15 pages.

"U.S. Appl. No. 11/168,023, Response filed Dec. 14, 2006 to Non-Final Office Action mailed Sep. 14, 2006", (Dec. 14, 2006), 11 pages.

"U.S. Appl. No. 11/168,023, Response filed Mar. 5, 2007 to Final Office Action mailed Jan. 25, 2007", (Mar. 5, 2007), 13 pages.

"U.S. Appl. No. 11/168,023, Repsonse filed Apr. 25, 2007 to Advisory Action mailed Mar. 30, 2007", (Apr. 25, 2007), 14 pages.

"U.S. Appl. No. 11/168,023, Response filed Sep. 18, 2007 to Non-Final Office Action mailed Jun. 18, 2007", (Sep. 18, 2007), 14.

"Final-Office Action Mailed Jul. 25, 2007 in U.S. Appl. No. 10/929,933", FOAR, 8.

* cited by examiner

METHOD TO CHEMICALLY REMOVE METAL IMPURITIES FROM POLYCIDE GATE SIDEWALLS

FIELD OF THE INVENTION

The present invention relates to semiconductor device fabrication. In particular, the present invention relates to fabrication of a metal electrode in a gate structure such as a tungsten word line, and to a process of resisting cross-contamination of volatilized metals during fabrication and field use.

BACKGROUND OF THE INVENTION

Integrated circuit technology relies on transistors to formulate functional circuits. The complexity of these circuits requires the use of an ever-increasing number of transistors. During the manufacture of some integrated circuits, field effect transistor (FET) gate electrodes and gate electrode interconnects are etched from an electrically conductive layer that covers other circuitry. For example, in semiconductor memory circuits, wherever a word line passes over a field oxide region, it functions as a gate electrode interconnect; wherever the word line passes over a gate dielectric layer overlying an active region, the word line functions as a gate electrode.

In previous integrated circuits, gate electrodes and electrode interconnects were often etched from a doped polycrystalline silicon (polysilicon) layer. However, faster operational speeds and low gate stack heights that are desirable for some applications could not be obtained using the polysilicon layer. Faster operational speeds, for example, are required for certain high-speed processor and memory circuits. Reduced gate stack heights are desirable for increasing the planarity of the integrated circuit to obtain better photolithographic resolution that is required with miniaturization. To achieve increased operational speeds and lower gate stack heights in more recent integrated circuits, it became necessary to reduce the sheet resistance of the conductive layer from which the gates and gate interconnects were formed.

As semiconductor devices continued to scale to smaller dimensions, reduced resistance in the gate electrode lines of FETs also became more important. One way to reduce the resistance and the topology in a gate electrode was to use a combination of polysilicon and refractory metal films. These are known as polycide gates.

One challenge in dynamic random access memory (DRAM) technology is to get the memory cell to hold a charge for longer periods of time. A longer period of time requires less frequent refreshing of the memory cell and allows for more efficient use of the memory controller for read/write/refresh demands. Leakage from the memory cell is a function of many things. There are several leakage mechanisms and pathways. For example, increased temperature will increase leakage. Impurities, traps, and defects in the junction or in the depletion width of the junction represent other leakage pathways. Further, impurities etc. in the source and drain, and defects in or near the gate will also increase leakage. Another cause of leakage includes gate-induced drain leakage (GIDL), also referred to as band-to-band tunneling. Another cause of leakage include sub-threshold leakage, which is backward tunneling of charge from the source to the drain. Another source of leakage is through the dielectric into the polysilicon, referred to as gate leakage.

Three oxidation-promoting processes are used during the gate fabrication that may cause a significant amount of metal to oxidize and to volatilize and redeposit in the substrate junctions and other regions. This redeposition of metal impurities is one source for many leakage pathways. The first is a chemical vapor deposition (CVD) of silicon dioxide or silicon nitride dielectric material over the metal layer prior to the gate stack etch. This dielectric material may become the dielectric cap for the gate stack.

The second oxidation-promoting process is a light thermal reoxidation. Various processes are used. They are sometimes referred to as a gate thickening oxidation (GTO), sometimes referred to as a "poly smile" oxidation, and sometimes referred to as "selective steam". The light thermal reoxidation process is carried out to oxidize some of the polysilicon in the gate stack without causing the volumetric expansion of the metal in the gate stack by resisting the formation of a metal oxide.

In the selective steam exemplary process, a wet hydrogen oxidation procedure was developed to allow the silicon to oxidize while leaving the metal such as tungsten unaffected in a post gate etch oxidation. The method was based on thermodynamic calculations which showed that at, for example, 1000° C. and a P(H2O)/P(H2) ratio (partial pressure ratio of $H_2O$ and $H_2$) of about $1.0 \times 10^{-05}$, the equilibrium:

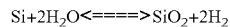

tends toward oxidation of Si, and

tends toward reduction of $WO_3$ to W. Therefore, it was possible to oxidize silicon again such that the oxidation rate of W would be reduced. However, W may volatilize during processing and recombine with the substrate in a manner that poisons active areas.

The third oxidation-promoting process is a sidewall formation of a dielectric that becomes the gate spacer.

During oxidation-promoting processes, the oxidation of silicon, including polysilicon, is self limiting to a degree. In other words, only a portion of the silicon will oxidize. Metals such as tungsten, are less self limiting. Accordingly, the tungsten may oxidize to a significant amount and even vaporize during any of these oxidation-promoting processes. Further, some metal may volatilize and recombine with portions of the semiconductor in ways that are detrimental to both device yield and field use life.

SUMMARY OF THE INVENTION

The above-mentioned problems with integrated circuits and other problems are addressed by embodiments set forth herein and will be understood by reading and studying the written description. Structure, process, and system embodiments are set forth herein.

A gate stack is formed that includes a metal film for a lower sheet resistance and a smaller topology as dictated by miniaturization needs. Processing of the gate stack includes the presence of a fluorine-containing composition that is co-deposited into at least one of several layers. The co-deposited fluorine acts to combine with metal in the gate stack as it volatilizes. The gaseous metal fluoride composition is swept away from the substrate and redeposition of the metal into areas of the substrate is avoided. Optionally or additionally, a fluorine-containing composition is used after a treatment such as a selective steam treatment, to scrub any metal out of the substrate that may have co-deposited.

In one embodiment, a semiconductor structure includes a substrate with a gate dielectric layer and a doped polysilicon layer disposed over the gate dielectric layer. A conductive barrier layer is disposed over the doped polysilicon layer. The conductive barrier layer is formed by CVD, PECVD, or PVD. The conductive barrier layer is co-deposited with a halogen or the like such as fluorine.

After the formation of the conductive barrier layer, a metal film is formed, that, in combination with the doped polysilicon layer makes up the polycide electrode. Formation of the metal film is carried out by CVD, PECVD, or the like, or by PVD or the like. During deposition of the metal film, a halogen-containing gas, such as a fluorine-containing gas is also be present that causes amounts of fluorine to co-deposit into the metal film. In another embodiment, the metal film is formed by one of CVD, PECVD, or PVD, without the presence of a halogen-containing gas.

A cap layer is formed over the metal film that later acts as a dielectric cap, or part of one, for a gate stack. In one embodiment, a $Si_3N_4$ cap layer is formed by CVD, PECVD, or PVD. During deposition, a fluorine-containing gas is present that causes amounts of fluorine to co-deposit into the cap layer. In another embodiment, cap layer 22 is formed by one of CVD, PECVD, or PVD, without the presence of a fluorine-containing gas.

A gate stack is etched from the semiconductor structure. During etching, some of the metal film may volatilize, but fluorine or the like is present in any one or all of structures. The presence of fluorine is sufficient to cause volatilizing amounts of the metal film to combine with fluoride ions that are likewise escaping from the layers and to form a gas such as $WF_6$ that can be swept out of the processing area before significant amounts of the metal can redeposit onto the substrate.

Further processing is carried out to treat the gate stack such as a selective steam oxidation. This treatment process is used to smooth and repair the side walls of the gate stack.

According to another embodiment, a system is set forth that includes a semiconductor structure and a processing tool comprising a chamber. Where CVD is used, the chamber supports CVD. Where PVD is used, the chamber supports PVD. Where a combination of CVD and PVD are used, the chamber includes two tools accordingly. The system includes at least one getterer composition selected from a getterer gas and a getterer solid. The getterer composition comprises a thermodynamic or kinetic advantage over the semiconductor structure for combining with the metal film.

According to another embodiment, an electrical device is set forth that includes the inventive gate stack. The electrical device is a system such as a memory module, or a processor.

These and other embodiments, aspects, advantages, and features of embodiments will be set forth in part in the description which follows, and in part will become apparent to those skilled in the art by reference to the following description of the embodiments and referenced drawings or by practice of embodiments.

BRIEF DESCRIPTION OF THE DRAWINGS

In the drawings, like reference numerals describe substantially similar components throughout the several views. Like numerals represent different orientational views of substantially similar components.

DETAILED DESCRIPTION OF THE INVENTION

The above-mentioned problems with integrated circuits and other problems are addressed by the present invention and will be understood by reading and studying the written description. Structure, system, and process embodiments are set forth herein.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1:
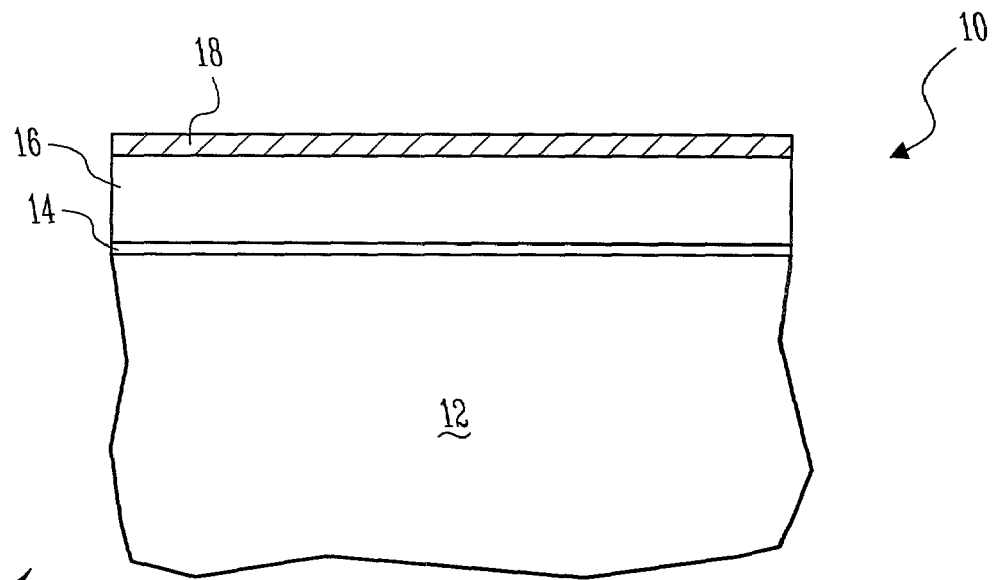
FIG. 1 is an elevational cross-section of a semiconductor structure that is being fabricated in accordance with an embodiment of the present invention.

Referring to FIG. 1, a semiconductor structure 10 includes a substrate 12 with a gate dielectric layer 14 and a doped polysilicon layer 16 disposed over gate dielectric layer 14. A conductive barrier layer 18 is disposed over doped polysilicon layer 16.

Conductive barrier layer 18 is impermeable to silicon and metal atoms. In some embodiments, conductive barrier layer 18 includes a nitrided metal or metal alloy. By way of non-limiting example, conductive barrier layer 18 includes tungsten nitride ($WN_x$) or titanium nitride (TiN) or the like. In one embodiment, conductive barrier layer 18 is a metal nitride such as tungsten nitride $W_xN_y$, wherein x and y may sum to be either a stoichiometric ratio, or a solid solution ratio. Conductive barrier layer 18 is formed by a method such as chemical vapor deposition (CVD), by plasma-enhanced CVD (PECVD), or by physical vapor deposition (PVD). During deposition, a fluorine-containing gas is present that causes amounts of fluorine to co-deposit into conductive barrier layer 18.

In one embodiment, CVD of tungsten nitride is carried out in the presence of a fluorine-containing gas such as $NF_3$. In one embodiment, the concentration of the fluorine-containing gas is $NF_3$ in a range from about 0.1% to about 10% by volume of the total CVD environment. In this embodiment, a tungsten nitride film forms as conductive barrier layer 18, and the concentration of fluorine that is disposed therein is in a range from about 0.1% to about 30% by weight. In another embodiment, the concentration of fluorine that is disposed therein is in a range from about 1% to about 20%.

In another embodiment, a PECVD process is carried out to form conductive barrier layer 18. A fluorine-containing gas such as $NF_3$ is present in the PECVD gas feed. The process is carried out by striking a plasma and metering a tungsten and nitrogen containing gas as well as a fluorine-containing gas. In one embodiment, the concentration of fluorine-containing gas, such as $NF_3$ is in a range from about 0.1% to about 10% by volume of the total PECVD environment. In this embodiment, a tungsten nitride film forms as conductive barrier layer 18, and the concentration of fluorine that is disposed therein is in a range from about 0.1% to about 30% by weight. In another embodiment, the concentration of the fluorine is in a range from about 1% to about 20%.

In another embodiment, a tungsten nitride target is provided for a PVD chamber, and a PVD process is carried out to form conductive barrier layer 18. PVD is carried out in the presence of a fluorine-containing gas. The concentration of fluorine-containing gas, such as $NF_3$ is in a range from about 0.1% to about 10% by volume of the total PVD environment. Typically, an inert gas such as argon (Ar) is used to act primarily as the sputtering gas. Although the exact mechanism is not set forth herein, conductive barrier layer 18 is formed with fluorine present in a range from about 0.1% to about 30% by weight. In another embodiment, fluorine is present in a range from about 1% to about 20%.

In another embodiment, conductive barrier layer 18 is formed by one of CVD, PECVD, or PVD, without the presence of a fluorine-containing gas.

Figure 2:
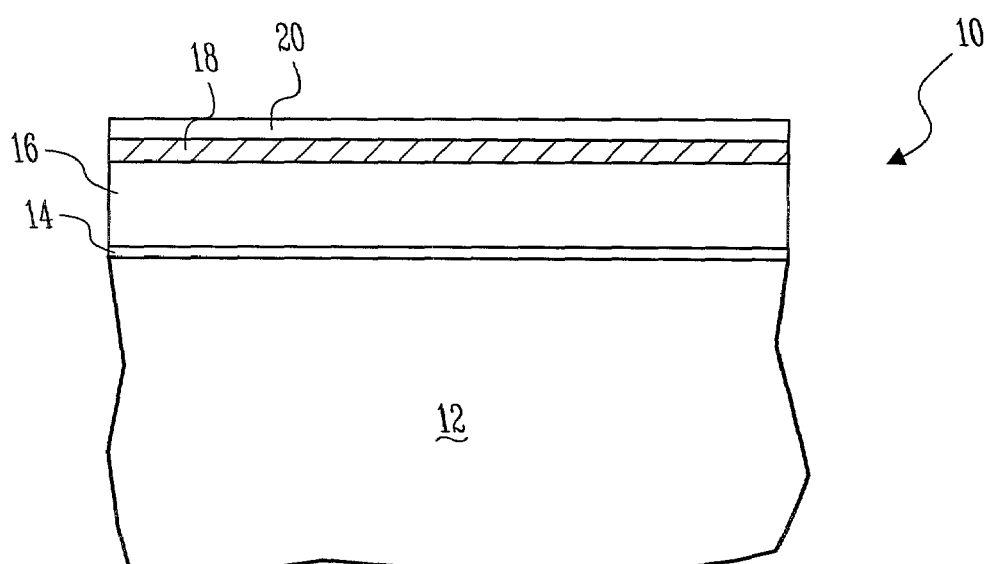
FIG. 2 is an elevational cross-section of the semiconductor structure depicted in FIG. 1 after further processing.

FIG. 2 illustrates further processing. After the formation of a structure that includes gate dielectric layer 14, doped polysilicon layer 16, and conductive barrier layer 18, a metal film 20 is formed, that, in combination with doped polysilicon layer 16 makes up the polycide electrode. Formation of metal film 20 is carried out by CVD, PECVD, or the like, or by PVD or the like. By way of non-limiting example, metal film 20 may comprise aluminum (Al), copper (Cu), silver (Ag), gold (Au), or the like or combinations thereof. In another embodiment, metal film 20 is a metal such as titanium (Ti), zirconium (Zr), hafnium (Hf), or the like or combinations thereof. In another embodiment, metal film 20 is a metal such as vanadium (V), tantalum (Ta), niobium (Nb), or the like or combinations thereof. Other metals for metal film 20 include nickel (Ni), cobalt (Co), palladium (Pd), platinum (Pt), or the like or combinations thereof. Other metals for metal film 20 include chromium (Cr), molybdenum (Mo), tungsten (W), or the like or combinations thereof. Other metals for metal film 20 include scandium (Sc), yttrium (Yt), lanthanum (La), cerium (Ce), or the like or combinations thereof. Other metals for metal film 20 include rhodium (Rh), osmium (Os), iridium (Ir), or the like or combinations thereof.

One property embodiment is that metal film 20 has a higher melting temperature than metals that are used for subsequent metallization. Thereby, although some volatilization of metal film 20 in some instances can occur during subsequent processing, metal film 20 according to the teachings of the present invention will not melt or decompose at higher, back-end processing conditions that follow its formation. Therefore, metal film 20 will not melt during fabrication, test, and ordinary field use.

Another property embodiment of metal film 20 is sufficient adhesive quality during fabrication, further processing, and field use, that metal film 20 will adhere to both conductive barrier layer 18 and to any structure that is formed over metal film. Accordingly, metals and alloys such as W, Ti, Cr, TiW, and the like are well-suited to the present invention.

In one embodiment, a W metal film 20 is formed by CVD. During deposition, a fluorine-containing gas is present that causes amounts of fluorine to co-deposit into metal film 20. In one embodiment, CVD of W is carried out in the presence of a fluorine-containing gas such as $NF_3$. The concentration of $NF_3$ is in a range from about 0.1% to about 10% by volume of the total CVD environment. In this embodiment, a W metal film 20 forms, and the concentration of fluorine that is disposed in therein is in a range from about 0.1% to about 30% by weight. In another embodiment, the concentration of fluorine is in a range from about 1% to about 20%.

In another embodiment, a PECVD process is carried out to form metal film 20. A fluorine-containing gas such as $NF_3$ is present in the PECVD gas feed. The process is carried out by striking a plasma and metering a tungsten-containing gas as well as a fluorine-containing gas. The concentration of fluorine-containing gas, such as $NF_3$ is in a range from about 0.1% to about 10% by volume of the total PECVD environment. In this embodiment, a W metal film 20 forms, and the concentration of fluorine that is disposed in therein is in a range from about 0.1% to about 30% by weight. In one embodiment, the concentration is in the range from about 1% to about 20%.

In another embodiment, a W target is provided for a PVD chamber, and a PVD process is carried out to form metal film 20. PVD is carried out in the presence of a fluorine-containing gas. The concentration of fluorine-containing gas, such as $NF_3$ is in a range from about 0.1% to about 10% by volume of the total PVD environment. Metal film 20 is formed with fluorine present in a range from about 0.1% to about 30% by weight. In another embodiment, the concentration is in a range from about 1% to about 20%.

In another embodiment, metal film 20 is formed by one of CVD, PECVD, or PVD, without the presence of a fluorine-containing gas.

With regard to barrier layer 18 and metal film 20 in combination, a variety of composites are formed according to various embodiments. In one embodiment, a given metal is used that results in a metal compound for barrier layer 18 such as a metal nitride, a metal oxide, a metal carbide, and the like. Further, the same metal is used for metal film 20. For example, W is used and barrier layer 18 is $W_xN_y$, and metal film 20 is W. In another embodiment, two different metals are used such as Ti and W. For example, Ti is used and barrier layer is $Ti_xN_y$ and metal film 20 is W.

Figure 3:
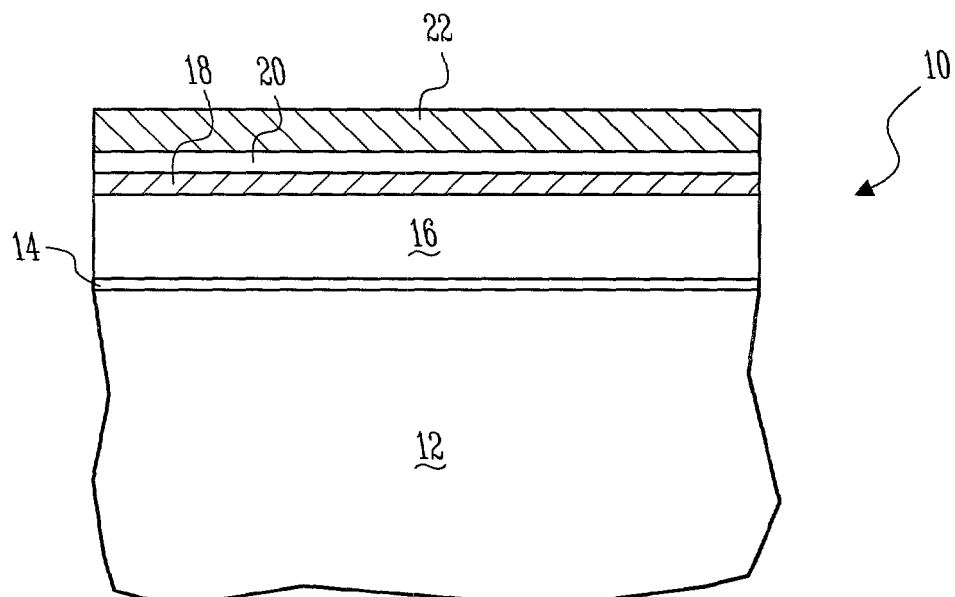
FIG. 3 is an elevational cross-section of the semiconductor structure depicted in FIG. 2 after further processing.

FIG. 3 illustrates further processing. A cap layer 22 is formed that may later act as a dielectric cap, or part of one, for a gate stack. Cap layer 22 is a silicon oxide such as silicon dioxide material such as $SiO_2$, or $Si_xO_y$, where x and y sum to a stoichiometric ratio or a solid solution ratio or the like. Optionally, cap layer 22 is a nitride such as silicon nitride material, for example $Si_3N_4$, or $Si_xN_y$, where x and y sum to a stoichiometric ratio or a solid solution ratio or the like.

In one embodiment, a $Si_3N_4$ cap layer 22 is formed by CVD. During deposition, a fluorine-containing gas is present that causes amounts of fluorine to co-deposit into cap layer 22. In one embodiment, CVD of a $Si_3N_4$ cap layer 22 is carried out in the presence of a fluorine-containing gas such as $NF_3$. The concentration of $NF_3$ is in a range from about 1% to about 10% by volume of the total CVD environment. In this embodiment, a $Si_3N_4$ cap layer 22 forms, and the concentration of fluorine that is disposed in therein is in a range from about 1% to about 30% by weight, preferably from about 2% to about 20%.

In another embodiment, a PECVD process is carried out to form $Si_3N_4$ cap layer 22. A fluorine-containing gas such as $NF_3$ is present in the PECVD gas feed. The process is carried out by striking a plasma and metering a silicon- and nitrogen-containing gas as well as a fluorine-containing gas. The concentration of fluorine-containing gas, such as $NF_3$ is in a range from about 1% to about 10% by volume of the total PECVD environment. In this embodiment, a $Si_3N_4$ cap layer 22 forms, and the concentration of fluorine that is disposed in therein is in a range from about 1% to about 30% by weight, preferably from about 2% to about 20%.

In another embodiment, a $Si_3N_4$ target is provided for a PVD chamber, and a PVD process is carried out to form cap layer 22. PVD is carried out in the presence of a fluorine-containing gas. The concentration of fluorine-containing gas, such as $NF_3$ is in a range from about 1% to about 10% by volume of the total PVD environment. Cap layer 22 is formed with fluorine present in a range from about 1% to about 30% by weight. In another embodiment, cap layer 22 is formed with fluorine present in a range from about 2% to about 20%.

In another embodiment, cap layer 22 is formed by one of CVD, PECVD, or PVD, without the presence of a fluorine-containing gas.

Figure 4:
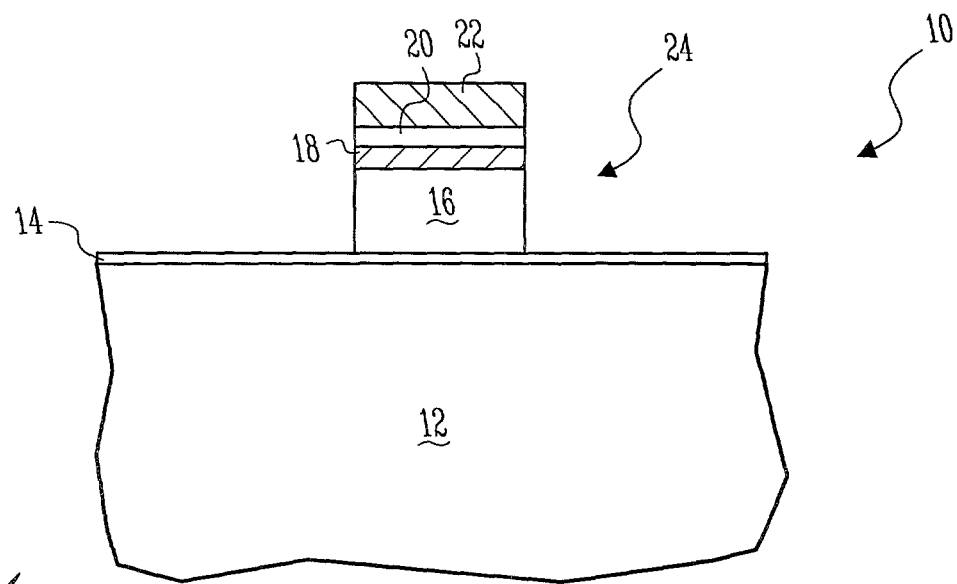
FIG. 4 is an elevational cross-section of the semiconductor structure depicted in FIG. 3 after further processing.

FIG. 4 illustrate further processing in which a gate stack 24 has been formed. Etching is done such as a dry anisotropic etch that may stop on gate dielectric layer 14, although some etching thereof may occur. During etching, some of metal film 20 may volatilize, but fluorine is present in any one or all of conductive barrier layer 18, metal film 20, or cap layer 22. The presence of fluorine is sufficient to cause volatilizing amounts of metal film 20 to combine with fluoride ions that is escaping from semiconductor structure 10 and to form a gas such as $WF_6$ that can be swept out of the processing area before significant amounts of the metal can redeposit onto substrate 12. It is preferred to have fluorine present in a low enough concentration such that HF is not produced. Otherwise, significant etching of gate dielectric layer 14 may occur, if it is an oxide, and other oxide layers. Preferably, the presence of fluorine such as $NF_3$, is in a range from about 1% to about 10% by volume. In one embodiment, the amount of fluorine is maintained low enough such that the formation of HF is prevented at concentrations that begin to etch gate dielectric layer 14.

In another processing embodiment, etching to form gate stack 24 is done in the presence of a fluorine-containing composition that is added to the etch gas mixture. Consequently, the presence of a fluorine-containing composition will cause volatilizing amounts of metal film 20 to combine with the fluorine-containing composition to form a compound such as $WF_6$ that can be swept out of the processing area before significant amounts of the metal can redeposit onto substrate 12. In one embodiment, the fluorine-containing composition in the etch gas is $NF_3$ or the like. In any event, the composition in the etch gas will preferably have a greater affinity, either kinetic or thermodynamic or both, for combining with the volatilizing metal in metal film 20 than the substrate 12.

In summary for the etching of gate stack 24, the presence of a fluorine-containing composition in the etch gas, in a given layer or film, or both, is used to preferentially combine with volatilizing metal. Thereby the fluorine acts to inhibit the poisoning of substrate 12 with otherwise redepositing metal that mobilizes out of metal film 20.

Further processing is carried out to treat gate stack 24. The gate stack 24 as shown in FIG. 4 includes an unpassivated conductive barrier layer 18 and metal film 20 and represents a starting point for the techniques described in greater detail below. The techniques can be used to help passivate the exposed surfaces of gate stack 24 so that it can be processed further in an oxidizing environment without undergoing conversion of the tungsten or other metal to a non-conductive compound.

Figure 5:
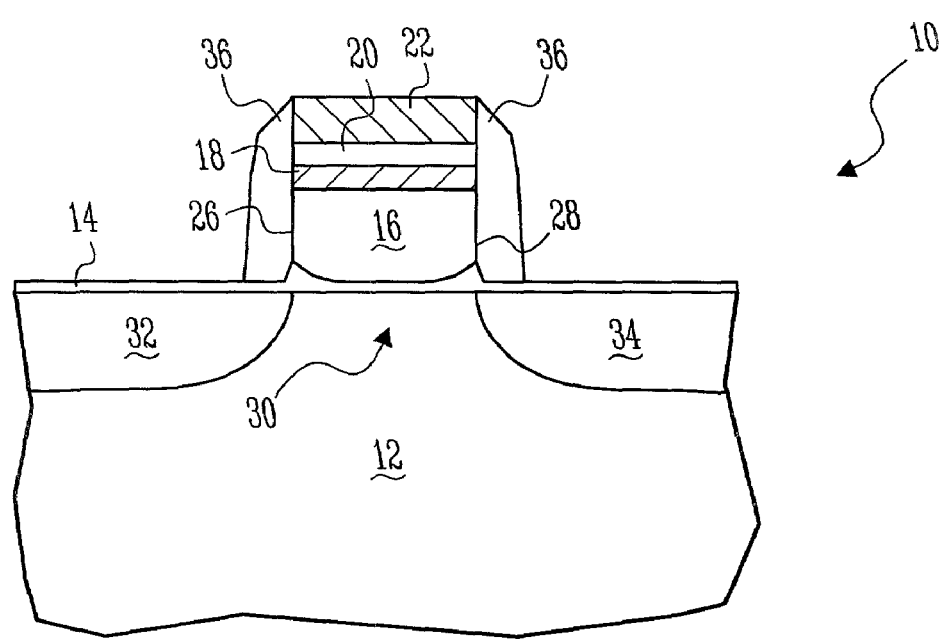
FIG. 5 is an elevational cross-section of the semiconductor structure depicted in FIG. 4 after further processing.

FIG. 5 illustrates this further processing. Etching of gate stack 24 typically leaves boundaries such as at gate stack side walls 26 and 28 that need treatment for better performance. A treatment process is used to smooth and/or repair the side walls 26, 28 of gate stack 24. This process flow is referred to as selective steam as is known in the art. As in other processes, the selective steam process flow may cause portions of metal film 20 to volatilize and redeposit into substrate 12. According to one embodiment, the presence of fluorine in the layers 18 and 22 or in metal film 20 may also mobilize and capture volatilizing atoms of metal film 20 to form a metal fluoride such as $WF_6$. Similarly, the presence of a fluorine-containing gas in the selective steam process flow can capture and combine with volatilizing atoms of metal film 20 to form a metal fluoride such as $WF_6$. During the selective steam (S/Steam) process flow, a characteristic shape 30 is formed immediately below polysilicon layer 16 in gate dielectric layer 14 that is referred to as the poly smile.

In one embodiment during this treatment process flow, it is preferable to hold the concentration of the fluorine-containing gas such as $NF_3$, to a range from about 1% to about 10% by volume, of the selective steam ambient in order to prevent the formation of HF in significant amounts. HF gas tends to etch oxide surfaces such as gate dielectric layer 14 where it is a gate oxide.

A process example is set forth below. In this example, a 0.25 micron process is used with its design rules. By way of further reference, according to design rules, a minimum feature is part of the metric of the semiconductor structure 10 depicted in the figures. In this embodiment, the minimum feature is the width, w, of gate stack 24 when measured laterally in the figures. For example, photolithography process flows may have minimum features that are 0.25 micrometers (microns), 0.18 microns, and 0.13 microns. It is understood that the various metrics such as 0.25 microns may have distinctly different dimensions in one business entity from a comparative business entity. Accordingly, such metrics, although quantitatively called out, may differ between a given two business entities. Other minimum features that are accomplished in the future are applicable to the present invention.

For this process embodiment, reference is made to FIGS. 1-5. A substrate 12 is provided with a gate dielectric layer 14 that is a thermal gate oxide of substrate 12. Substrate is monocrystalline silicon with a <100> orientation in preparation for a metal oxide semiconductor (MOS) FET. A doped polysilicon layer 16 is formed by CVD of a silicon-bearing composition such as silane (SiH$_4$) in the presence of a dopant such as arsenic (As). Thereafter, a conductive barrier layer 18 is formed by PVD of a tungsten nitride target in the presence of about 10% NF$_3$ gas in addition to Ar gas.

After the formation of conductive barrier layer 18, a metal film 20 is formed by sputtering from a tungsten target in the presence of about 10% NF$_3$ gas in addition to Ar gas. Thereafter, a cap layer 22 is formed. Cap layer is sputtered from a Si$_3$N$_4$ target in the presence of NF$_3$.

An anisotropic dry etch is carried out to form gate stack 24. The anisotropic dry etch stops on gate dielectric layer 14 and is carried out with about 1% NF$_3$.

Processing is next carried out to anneal or otherwise treat the side walls 26, 28 of gate stack without oxidizing significant portions of metal film 20. A selective steam process is selected from commercial vendors, and a modification is made by adding NF$_3$ to the process in an amount of about 1%. Further processing is carried out to make semiconductor structure 10 an active device. For example, implantation of As is carried out to form a source 32 and drain 34 that are self-aligned with gate stack 24. A spacer layer is deposited and spacer etched over gate stack 24 according to known technique to form a spacer 36. The presence of a fluorine-containing composition such as NF$_3$ is present in either or both the spacer layer deposition and the spacer etch.

In other process examples, the presence of a fluorine-containing composition during processing is included or excluded, so long as at least one process in the process flow contains the presence of a fluorine-containing composition.

In another process example, no deposition or oxidation process includes the presence of a fluorine-containing composition such as NF$_3$, however, an NF$_3$ clean-up process is used after the selective steam process to scrub any re-deposited metal from metal film 20 away from substrate 12. In another process example the NF$_3$ clean-up process (NF$_3$ scrub) is used in connection with other processes that include a fluorine-containing gas as set forth herein. Table 1 is just one set of processing combinations that is employed wherein a fluorine-containing composition is present according to the teachings of the present invention. The presence of a fluorine-containing composition is indicated by an X.

TABLE 1

| | Processing Examples | | | | | |
|---|---|---|---|---|---|---|
| Item | Ex. 1 | Ex. 2 | Ex. 3 | Ex. 4 | Ex. 5 | Ex. 6 |
| layer 18 | X | X | X | X | X | |
| film 20 | X | X | X | X | | X |
| cap 22 | X | X | X | | X | X |
| S/Steam | X | X | | X | X | X |
| NF$_3$ scrub | X | | X | X | X | X |

Example 6 illustrates the beginning of a second series of process flows that omits the presence of a fluorine-containing composition during the formation of conductive barrier layer 18. Other series are constructed wherein two processes omit the presence of a fluorine-containing composition. Yet other series are constructed wherein three processes omit the presence of a fluorine-containing composition. Similarly, another series are constructed wherein four processes omit the presence of a fluorine-containing composition.

In one embodiment, the presence of fluorine in any of conductive barrier layer 18, metal film 20, and cap layer 22 accounts for more that about nine parts in ten for total removal of metal that volatilizes out of metal film 20 during any or all of the processes set forth herein. The remainder of metal that volatilizes out of metal film 20 is scrubbed by the presence of fluorine in a gas form such as NF$_3$, during the selective steam process, or the scrub process. In any event, the combination of fluorine in one of the layers or the film, and the fluorine gas during selective steam processing or a post-oxide scrub, amounts to more that about 95% of volatilized metal being combined into a volatile gas and being swept away from substrate 12. In another embodiment, more than about 99% of volatilized metal is combined into a volatile gas and is swept away from substrate 12.

According to another embodiment, a system is set forth that includes a semiconductor structure 10 including a substrate 12, and a metal film 20 disposed over the substrate 12. The metal film 20 is selected from a metal as set forth herein. The system includes a processing tool comprising a chamber. Where CVD is used, the chamber supports CVD. Where PVD is used, the chamber supports PVD. Where a combination of CVD and PVD are used, the chamber includes two tools accordingly. The system includes at least one getterer composition selected from a getterer gas and a getterer solid. The getterer composition comprises a thermodynamic or kinetic advantage over the semiconductor structure 10 for combining with the metal film 20. In one embodiment, the getterer compound is a fluorine-containing composition, or another composition such as another halogen.

Although the written description has illustrated the use of a fluorine-containing composition in virtually all examples, it is understood that other metal-reducing compositions are used, such as the other halogens, other compositions, or combinations thereof. So long as the composition acts to preferentially combine with volatilized portions of metal such as metal film 20 instead of substrate 12, the conditions are met that reduce redeposition of the substrate 12 and/or the gate stack 24 according to the teachings of the present invention. Accordingly, a composition that combines with and reduces metal into a gaseous compound, that has either a kinetic or thermodynamic advantage over the substrate 12 for this combination, is intended according to the teachings of the present invention.

Figure 6:
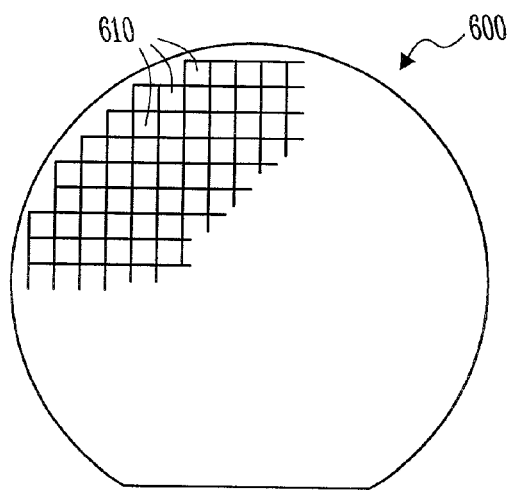
FIG. 6 is a top view of a wafer or substrate containing semiconductor dies in accordance with an embodiment of the present invention.

In another embodiment, systems are made that include the process embodiments or the gate stack embodiments according to the teachings of the present invention. With reference to FIG. 6, a semiconductor die 610 is produced from a silicon wafer 600 that contains the transistor embodiment such as is depicted in FIG. 5. A die 610 is an individual pattern, typically rectangular, on a substrate 12 that contains circuitry to perform a specific function. A semiconductor wafer 600 will typically contain a repeated pattern of such dies 610 containing the same functionality. Die 610 may further contain additional circuitry to extend to such complex devices as a monolithic processor with multiple functionality. Die 610 is typically packaged in a protective casing (not shown) with leads extending therefrom (not shown) providing access to the circuitry of the die 610 for unilateral or bilateral communication and control. In one embodiment, die 610 is encased in a host such as a chip package (not shown) such as a chip-scale package (CSP).

Figure 7:
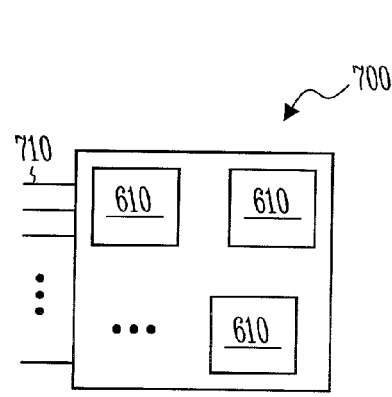
FIG. 7 is a block schematic diagram of a circuit module in accordance with an embodiment of the present invention.

As shown in FIG. 7, two or more dies 610 at least one of which contains at least one transistor embodiment such as is depicted in FIG. 5, in accordance with the present invention are combined, with or without protective casing, into a host such as a circuit module 700 to enhance or extend the functionality of an individual die 610. Circuit module 700 is a chip set that is a combination of dies 610 from FIG. 6 representing a variety of functions, or a combination of dies 610 containing the same functionality. Some examples of a circuit module 700 include memory modules, device drivers, power modules, communication modems, processor modules and application-specific integrated circuit (ASIC) modules and include multi-layer, multi-chip modules. Circuit module 700 is a sub-component of a variety of electronic systems, such as a clock, a television, a cell phone, a personal computer, an automobile, an industrial control system, an aircraft and others. Circuit module 700 will have a variety of leads 710 extending therefrom providing unilateral or bilateral communication and control.

Figure 8:
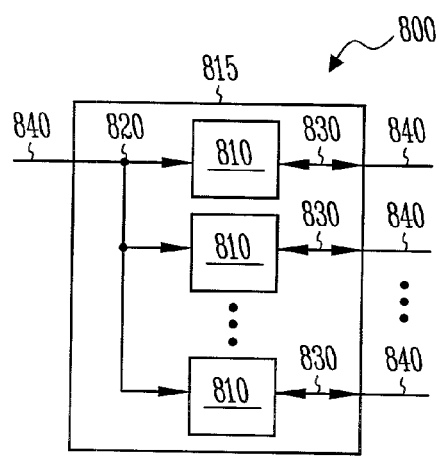
FIG. 8 is a block schematic diagram of a memory module in accordance with an embodiment of the present invention.

FIG. 8 shows one embodiment of a circuit module as memory module 800 containing a structure for the transistor embodiment as is depicted in FIG. 5. Memory module 800 generally depicts a Single In-line Memory Module (SIMM) or Dual In-line Memory Module (DIMM). A SIMM or DIMM may generally be a printed circuit board (PCB) or other support containing a series of memory devices. While a SIMM will have a single in-line set of contacts or leads, a DIMM will have a set of leads on each side of the support with each set representing separate I/O signals. Memory module 800 acts as a host that contains multiple memory devices 810 contained on support 815, the number depending upon the desired bus width and the desire for parity. Memory module 800 contains memory devices 810 on both sides of support 815. Memory module 800 accepts a command signal from an external controller (not shown) on a command link 820 and provides for data input and data output on data links 830. The command link 820 and data links 830 are connected to leads 840 extending from the support 815. Leads 840 are shown for conceptual purposes and are not limited to the positions shown in FIG. 8.

Figure 9:
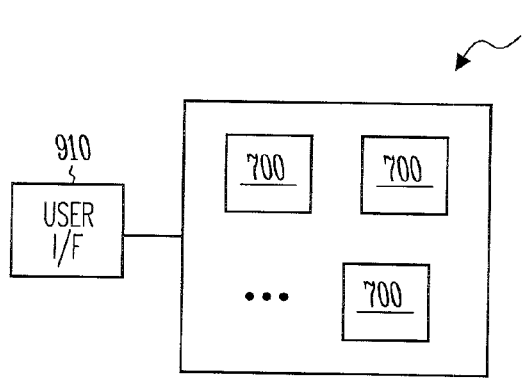
FIG. 9 is a block schematic diagram of an electronic system in accordance with another embodiment the present invention.

FIG. 9 shows another host type such as an electronic system 900 containing one or more circuit modules 700 as described above containing at least one transistor embodiment according to the teachings of the present invention. Electronic system 900 generally contains a user interface 910. User interface 910 provides a user of the electronic system 900 with some form of control or observation of the results of the electronic system 900. Some examples of user interface 910 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 910 may further describe access ports provided to electronic system 900. Access ports are used to connect an electronic system to the more tangible user interface components previously exemplified. One or more of the circuit modules 700 from FIG. 7 is a processor providing some form of manipulation, control or direction of inputs from or outputs to user interface 910, or of other information either preprogrammed into, or otherwise provided to, electronic system 900. As will be apparent from the lists of examples previously given, electronic system 900 will often contain certain mechanical components (not shown) in addition to the circuit modules 700 and user interface 910. It will be appreciated that the one or more circuit modules 700 in electronic system 900 can be replaced by a single integrated circuit. Furthermore, electronic system 900 is a sub-component of a larger electronic system.

Figure 10:
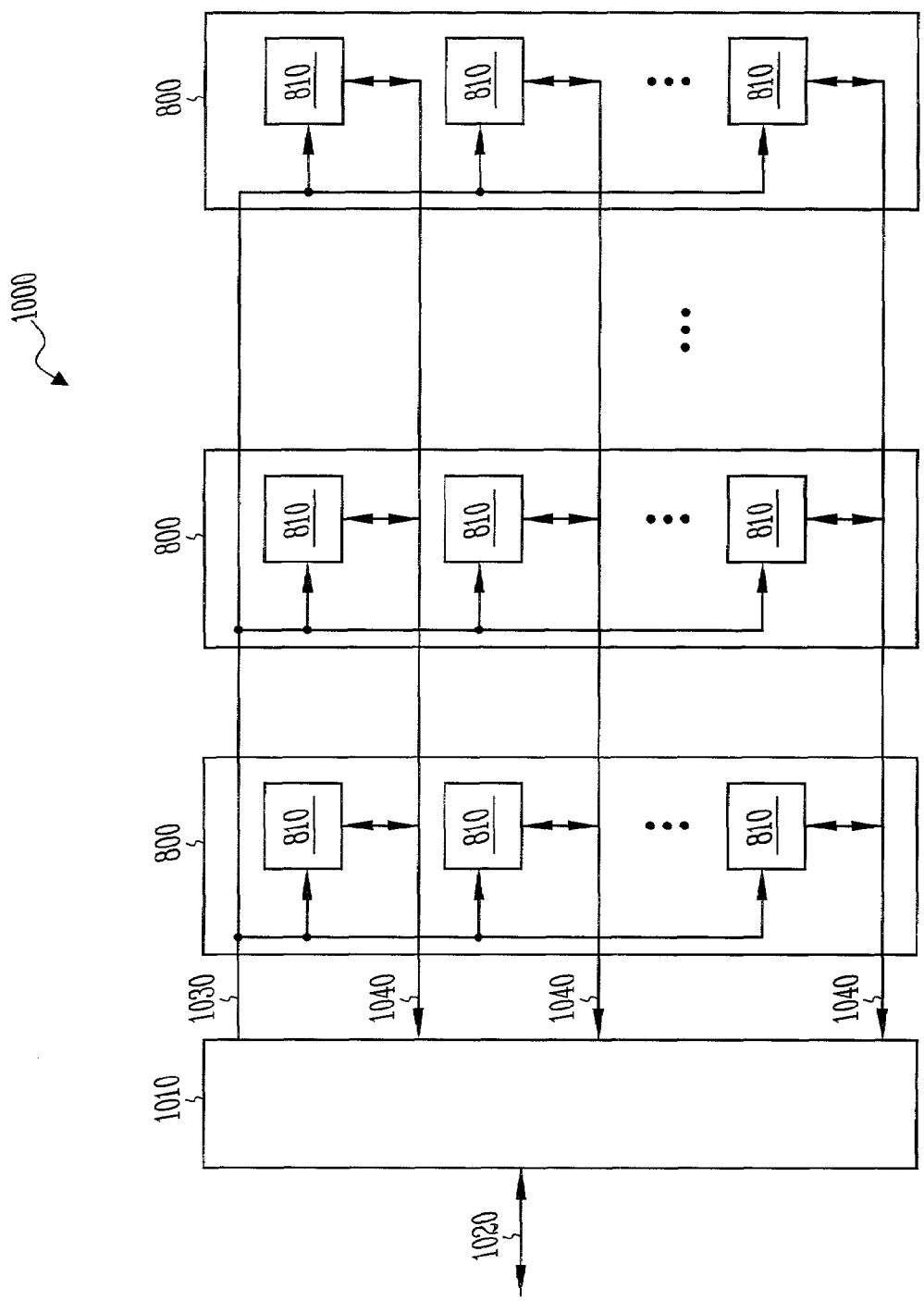
FIG. 10 is a block schematic diagram of a memory system in accordance with an embodiment of the present invention.

FIG. 10 shows one embodiment of an electrical device at a system level. The electronic system depicted in FIG. 10 is a memory system 1000. Memory system 1000 acts as a higher-level host that contains one or more memory modules 800 as described above including at least one embodiment of the transistor as set forth herein. In accordance with the present invention, memory system 1000 includes a memory controller 1010 that may also include circuitry that contains the transistor embodiment. Memory controller 1010 provides and controls a bidirectional interface between memory system 1000 and an external system bus 1020. Memory system 1000 accepts a command signal from the external bus 1020 and relays it to the one or more memory modules 800 on a command link 1030. Memory system 1000 provides for data input and data output between the one or more memory modules 800 and external system bus 1020 on data links 1040.

Figure 11:
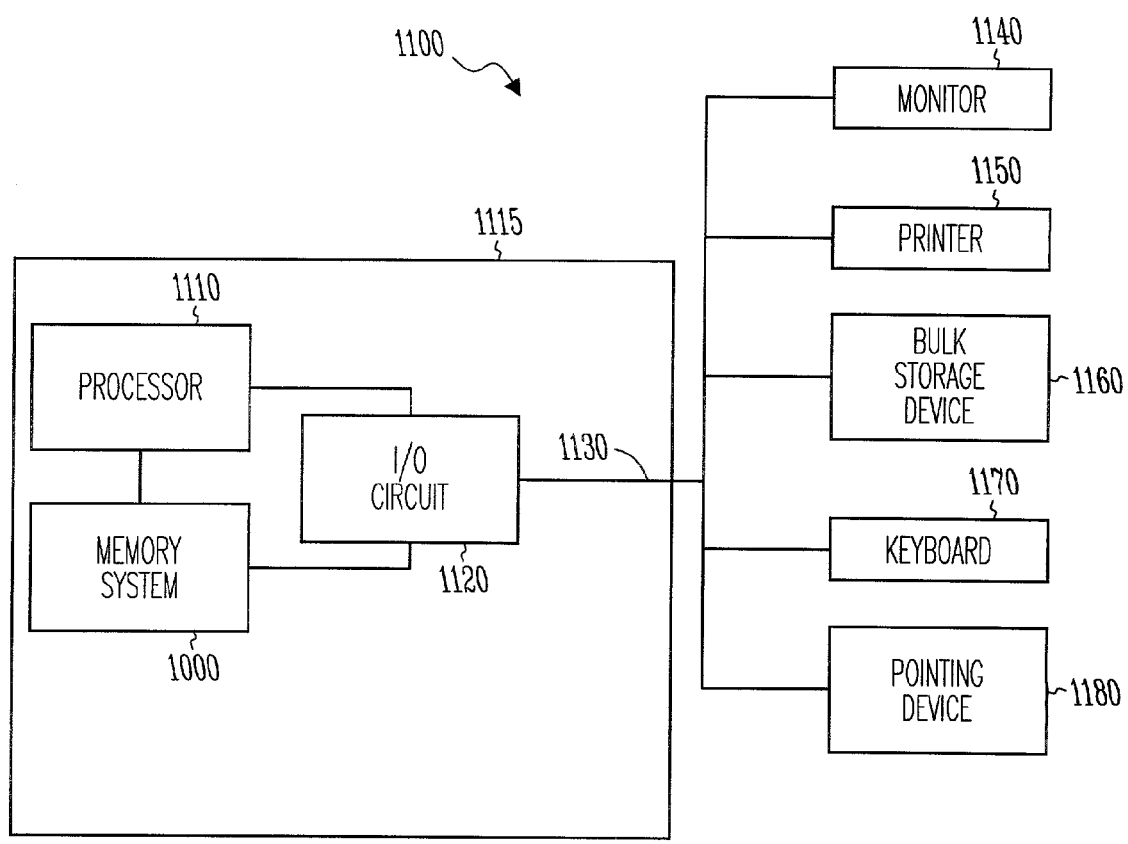
FIG. 11 is a block schematic diagram of a computer system in accordance with an embodiment of the present invention.

FIG. 11 shows a further embodiment of a higher-level host such as an electronic computer system 1100. Computer system 1100 contains a processor 1110 and a memory system 1000 housed in a computer unit 1115. Computer system 1100 is but one example of an electronic system containing another electronic system, i.e. memory system 1000, as a sub-component. The computer system 1100 contains an input/output (I/O) circuit 1120 that is coupled to the processor 1110 and the memory system 1000. Computer system 1100 optionally contains user interface components that are coupled to the I/O circuit 1120. In accordance with the present invention at least one transistor embodiment is coupled to one of a plurality of I/O pads or pins 1130 of the I/O circuit 1120. The I/O circuit 1120 may then be coupled a monitor 1140, a printer 1150, a bulk storage device 1160, a keyboard 1170 and a pointing device 1180. It will be appreciated that other components are often associated with computer system 1100 such as modems, device driver cards, additional storage devices, etc. It will further be appreciated that the processor 1110, memory system 1000, I/O circuit 1120 and transistor embodiments of computer system 1100 can be incorporated on a single integrated circuit. Such single package processing units reduce the communication time between the processor 1110 and the memory system 1000.

CONCLUSION

A gate stack is formed that includes a metal film for a lower sheet resistance and a smaller topology for use in integrated circuits. Processing of the gate stack includes the presence of a fluorine-containing composition that is co-deposited into at least one of several layers. The co-deposited fluorine acts to combine with metal in the gate stack as it volatilizes. The metal fluoride composition is swept away from the substrate and redeposition of the metal into areas of the substrate is avoided. The fluorine-containing composition can be used after a treatment such as a selective steam treatment, to scrub any metal out of the substrate that may have co-deposited. A process is also provided by which the gate stack is fabricated.

With reference to a gate structure such as a DRAM transistor, impurities that mobilize during various oxidation-promoting processes, that add to cell leakage are substantially not allowed to deposit in the junction and other regions.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process of treating a semiconductor structure comprising:
   providing a substrate;
   providing a gate stack comprising a gate dielectric layer disposed over the substrate; a polysilicon layer disposed over the gate dielectric layer; a barrier layer disposed over the polysilicon layer, and a metal film disposed over the barrier layer;
   patterning the metal film, barrier layer and polysilicon layer to form a pattered gate stack; and
   oxidizing the patterned gate stack under conditions providing at least one of a halogen and a material having a thermodynamic advantage over the substrate in volatilizing the metal film that reduce redeposition of the metal film on the substrate and on the gate stack of a volatilized portion of the metal film;
   wherein the conditions that reduce redeposition include using a fluorine-containing composition that is metered to the substrate and gate stack in gaseous form.

2. The process according to claim 1, wherein the fluorine-containing composition includes $NF_3$ gas.

3. A process of treating a semiconductor structure comprising:
   providing a substrate;
   providing a gate stack comprising a gate dielectric layer disposed over the substrate; a polysilicon layer disposed over the gate dielectric layer; a barrier layer disposed over the polysilicon layer, and a metal film disposed over the barrier layer;
   patterning the metal film, barrier layer and polysilicon layer to form a pattered gate stack; and
   oxidizing the patterned gate stack under conditions providing at least one of a halogen and a material having a thermodynamic advantage over the substrate in volatilizing the metal film that reduce redeposition of the metal film on the substrate and on the gate stack of a volatilized portion of the metal film;
   wherein the conditions that reduce redeposition include using a fluorine-containing composition disposed in a layer in the gate stack, and a fluorine-containing composition that is metered to the substrate and gate stack in gaseous form.

4. A process comprising:
   forming a metal film over a structure; and
   thermally processing the structure in the presence of a first composition such that the metal is more likely to combine with at least a portion of the first composition than with the structure;
   wherein the first composition comprises $NF_3$.

5. The process according to claim 4, wherein the first composition comprises $NF_3$ in a gaseous state.

6. A process comprising:
   forming a doped polysilicon layer over a substrate;
   forming a barrier layer over the doped polysilicon layer;
   forming a metal film over the barrier layer;
   forming a nitride layer over the metal film to form a gate stack disposed on a substrate; and
   thermally processing the gate stack in the presence of a fluorine-containing composition under conditions sufficient to cause the metal film more likely to combine with the fluorine-containing composition than with the gate stack or the substrate.

7. The process according to claim 6, wherein the barrier layer includes a metal nitride barrier layer.

8. The process according to claim 6, wherein the gate stack and the substrate include oxide surfaces, and wherein the conditions are sufficient to cause the fluorine-containing composition to resist etching the oxide surfaces.

9. The process according to claim 6, wherein the fluorine-containing composition comprises $NF_3$.

10. The process according to claim 6, wherein the metal film is selected from Al, Cu, Ag, Au, Ti, Zr, Hf, Ni, Co, Pd, Pt, V, Ta, Nb, Cr, Mo, W, Sc, Yt, La, Ce, Rh, Os, Ir, and combinations thereof.

11. A process of forming a gate stack comprising:
    providing a substrate;
    forming a gate dielectric layer over the substrate;
    depositing a polysilicon layer over the gate dielectric layer;
    forming a metal film above the polysilicon layer;
    forming a cap layer over metal film;
    etching a gate stack through the cap layer, the metal film, and the polysilicon layer, under conditions that reduce redeposition on the substrate of a volatilized portion of the metal film; and
    wherein at least one process of depositing a polysilicon layer, forming a metal film, and forming a cap layer is carried out in the presence of a metal-reducing composition; and
    oxidizing the polysilicon layer under conditions that reduce redeposition on the substrate and the gate stack of a volatilized portion of the metal film.

12. The process according to claim 11 following etching a gate stack, further comprising:
    forming a spacer layer over the gate stack under conditions providing at least one of a halogen and a material having a thermodynamic advantage over the substrate in volatilizing the metal film that reduce redeposition on the substrate and the gate stack of a volatilized portion of the metal film.

13. A process of forming a gate stack comprising:
    providing a substrate;
    forming a gate dielectric layer over the substrate;
    depositing a polysilicon layer over the gate dielectric layer;
    forming a metal film above the polysilicon layer;
    forming a cap layer over metal film;
    etching a gate stack through the cap layer, the metal film, and the polysilicon layer, under conditions that reduce redeposition on the substrate of a volatilized portion of the metal film;
    wherein at least one process of depositing a polysilicon layer, forming a metal film, and forming a cap layer is carried out in the presence of a metal-reducing composition; following etching a gate stack, further comprising:
    oxidizing the polysilicon layer under conditions that reduce redeposition on the substrate and the gate stack of a volatilized portion of the metal film;
    forming a spacer layer over the gate stack under conditions that reduce redeposition on the substrate and the gate stack of a volatilized portion of the metal film; and
    wherein the conditions that reduce redeposition include using a halogen-containing composition that is metered to the substrate and gate stack in gaseous form.

14. A process of forming a gate stack comprising:
    providing a substrate;
    forming a gate dielectric layer over the substrate;
    depositing a polysilicon layer over the gate dielectric layer;
    forming a metal film above the polysilicon layer;
    forming a cap layer over metal film;

etching a gate stack through the cap layer, the metal film, and the polysilicon layer, under conditions that reduce redeposition on the substrate of a volatilized portion of the metal film;

wherein at least one process of depositing a polysilicon layer, forming a metal film, and forming a cap layer is carried out in the presence of a metal-reducing composition; following etching a gate stack, further comprising:

oxidizing the polysilicon layer under conditions that reduce redeposition on the substrate and the gate stack of a volatilized portion of the metal film;

forming a spacer layer over the gate stack under conditions that reduce redeposition on the substrate and the gate stack of a volatilized portion of the metal film; and wherein the conditions that reduce redeposition include using $NF_3$ gas that is metered to the substrate and gate stack.

15. The process according to claim 12, wherein the conditions that reduce redeposition include using a halogen-containing composition disposed in a layer or the film in the gate stack, and a halogen-containing composition that is metered to the substrate and gate stack in gaseous form.

16. The process according to claim 12, wherein the conditions that reduce redeposition include using fluorine disposed in the cap layer over the metal film.

* * * * *